US010224088B1

(12) United States Patent
Choy et al.

(10) Patent No.: US 10,224,088 B1
(45) Date of Patent: Mar. 5, 2019

(54) MEMORY WITH A GLOBAL REFERENCE CIRCUIT

(71) Applicant: NXP USA, INC., Austin, TX (US)

(72) Inventors: Jon Scott Choy, Austin, TX (US); Michael Garrett Neaves, Austin, TX (US); Michael A. Sadd, Austin, TX (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 15/894,399

(22) Filed: Feb. 12, 2018

(51) Int. Cl.
| | |
|---|---|
| *G11C 11/00* | (2006.01) |
| *G11C 11/16* | (2006.01) |
| *G11C 7/06* | (2006.01) |
| *G11C 7/14* | (2006.01) |

(52) U.S. Cl.
CPC .......... *G11C 11/1673* (2013.01); *G11C 7/062* (2013.01); *G11C 7/14* (2013.01); *G11C 11/1675* (2013.01)

(58) Field of Classification Search
CPC ........ G11C 7/14; G11C 7/062; G11C 11/1673
USPC .................................................... 365/210.14
See application file for complete search history.

(56) References Cited

U.S. PATENT DOCUMENTS

| | | | |
|---|---|---|---|
| 6,445,612 B1 | 9/2002 | Naji | |
| 6,538,940 B1* | 3/2003 | Nahas | G11C 11/16 365/158 |
| 6,600,690 B1* | 7/2003 | Nahas | G11C 7/067 365/158 |
| 7,038,959 B2* | 5/2006 | Garni | G11C 7/062 365/203 |
| 7,116,598 B2* | 10/2006 | Shimizu | G11C 7/062 365/210.1 |
| 7,292,484 B1 | 11/2007 | Andre et al. | |
| 7,751,258 B2* | 7/2010 | Tsuchida | G11C 5/147 365/158 |
| 8,184,476 B2 | 5/2012 | Nahas et al. | |
| 8,254,195 B2* | 8/2012 | Rao | G11C 11/16 365/157 |
| 8,693,273 B2* | 4/2014 | Yuh | G11C 11/1673 365/148 |
| 8,737,120 B2 | 5/2014 | Guo et al. | |
| 2005/0083747 A1* | 4/2005 | Tang | G11C 5/147 365/210.1 |

OTHER PUBLICATIONS

Huang, K., "Optimization Scheme to Minimize Reference Resistance Distribution of Spin-Transfer-Torque MRAM", IEEE Transactions on Very Large Scale Integration (VLSI) Systems, vol. 22, No. 5, May 2014.

(Continued)

*Primary Examiner* — Son L Mai
(74) *Attorney, Agent, or Firm* — David G. Dolezal

(57) ABSTRACT

A memory includes a global reference circuit for generating a signal that controls the resistance of a plurality of reference devices used to read data in memory cells by sense amplifiers of the memory. The signal is generated by an output of an operational amplifier of the global reference circuit. The operational amplifier includes a first input whose voltage is set by flowing current through a reference circuit and a second input whose voltage is set by flowing current through a master reference device. The signal controls the resistance of the master reference device such that the voltages of the inputs of the operational amplifier match.

20 Claims, 3 Drawing Sheets

(56) References Cited

OTHER PUBLICATIONS

Jefremow, M., "Time-Differential Sense Amplifier for Sub-80mV Bitline Voltage Embedded STT-MRAM in 40nm CMOS", ISSCC 2013 / Session 12 / Non-Volatile Memory Solutions / 12.4 (2013).
Na, T., "Reference-Scheme Study and Novel Reference Scheme for Deep Submicrometer STT-RAM", IEEE Transactions on Circuits and Systems—I: Regular Papers, vol. 61, No. 12, Dec. 2014.
U.S. Appl. No. 15/293,335 entitled "Sense Amplifier Circuit", filed Oct. 14, 2016.

* cited by examiner

MEMORY WITH A GLOBAL REFERENCE CIRCUIT

BACKGROUND OF THE INVENTION

Field of the Invention

This invention relates in general to a memory and more specifically to a memory with a global reference circuit.

Background

Some memories utilize sense amplifiers for comparing the data state of a memory cell with a reference cell to determine the value stored in the memory cell during a memory read operation.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The Figures are not necessarily drawn to scale.

DETAILED DESCRIPTION

The following sets forth a detailed description of a mode for carrying out the invention. The description is intended to be illustrative of the invention and should not be taken to be limiting.

As disclosed herein, a memory includes a global reference circuit for generating a signal that controls the resistance of a plurality of reference devices used to read data in memory cells by sense amplifiers of the memory. The signal is generated by an output of an operational amplifier of the global reference circuit. The operational amplifier includes a first input whose voltage is set by flowing current through a reference circuit and a second input whose voltage is set by flowing current through a master reference device. The signal controls the resistance of the master reference device such that the voltages of the inputs of the operational amplifier match.

With some embodiments, providing such a global reference circuit may enable a memory to include a plurality of reference devices that each can provide a trimmable resistance but where the plurality of reference devices do not have to be individually trimmed.

In other embodiments, the resistance circuit of the global reference circuit can include multiple memory storage elements programmed at high resistance data states and low resistance data states to provide a reference resistance value that changes with the memory storage elements of the memory over time, temperature, voltage, and/or process variation. Because the global reference circuit signal controls the resistance of the reference devices used by multiple sense amplifiers of the memory, the resistance value provided to those sense amplifiers during a memory read operation is relatively stable with respect to the memory storage elements of the memory over time, temperature, voltage, and/or and process variation without each reference device having to include multiple memory storage elements.

Figure 1:
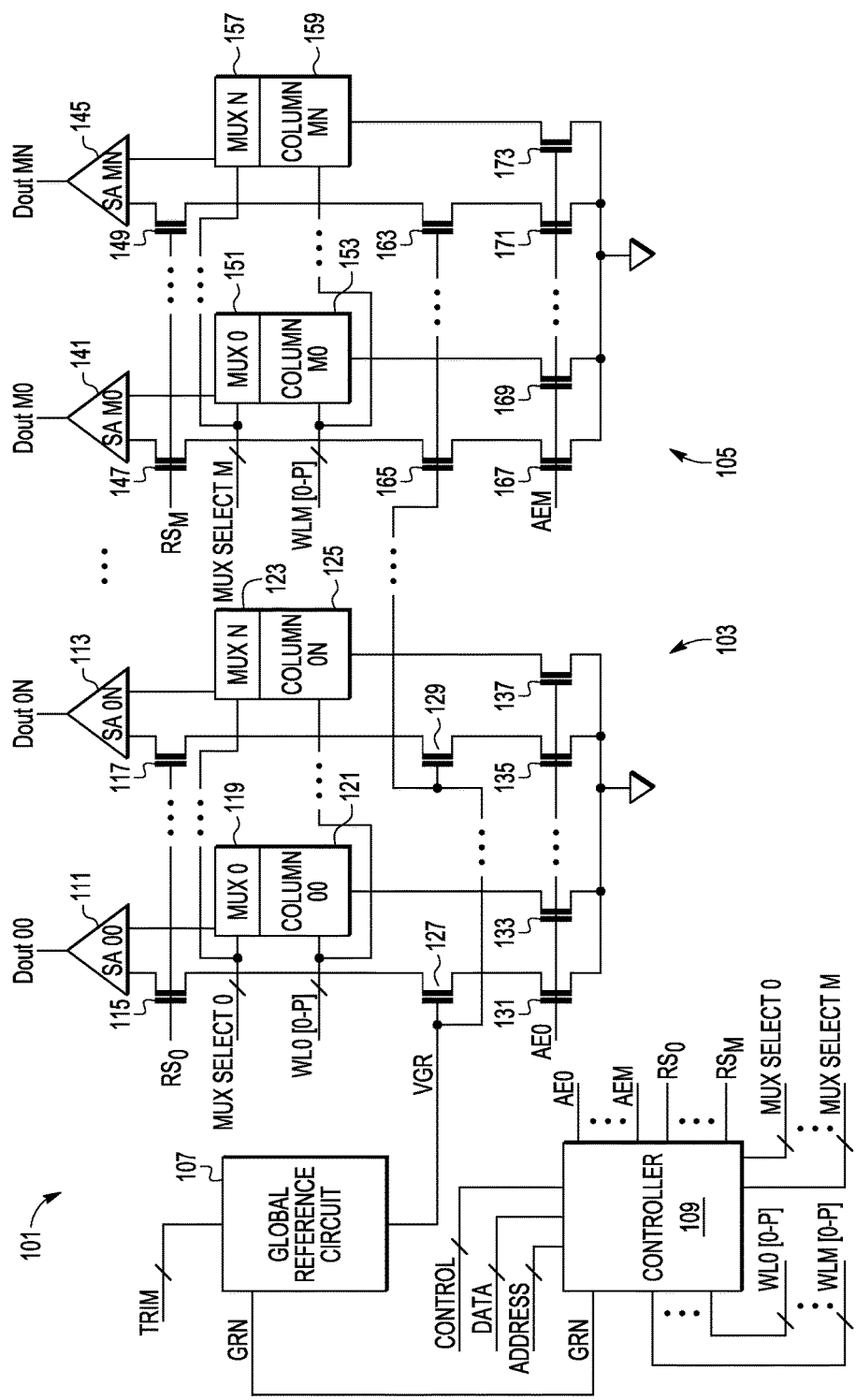
FIG. 1 is a circuit diagram of a memory according to one embodiment of the present invention.

FIG. 1 is a circuit diagram of a memory according to one embodiment of the present invention. Memory 101 includes array circuit 103 and array circuit 105. Array circuit 103 and array circuit 105 each include an array of memory cells located in columns blocks (121, 125, 153, and 159) for storing data. As used herein with respect to information stored in a memory, the term "data" also includes instructions or commands stored in a memory. In the embodiment shown, a column of a column block is selectively coupled to a sense amplifier (111, 113, 141, and 145) by a multiplexer (119, 123, 151, and 157, respectively) during a memory read operation of a memory cell of the column. The particular column of a column block selected to be coupled to a sense amplifier is controlled by a MUX select signal (Mux Select 0, Mux Select M). The particular memory cell of a selected column to be coupled to a sense amplifier is controlled by an asserted word line of a set of word lines (WL0[0-P], WLM[0-P]).

Memory 101 includes a number of reference devices 127, 129, 165, and 163 whose resistances are set to a value between a high resistance data state value (indicating one value (e.g. "0")) and a low resistance data state value (indicating another value (e.g. "1")) stored in memory cells of the column blocks 121, 123, 151, and 159. During a memory read operation of a memory cell, one input of a sense amplifier (e.g. 111) is coupled to the selected memory cell of the column block (e.g. 121) and the other input is coupled to a reference device (e.g. 127). By comparing the resistance of the memory cell with the resistance of the reference device, the sense amplifier can determine whether a 1 or 0 is stored in the cell and provide an indication at its output (e.g. DOUT 00 for sense amplifier 111).

In one embodiment, the memory cells are MRAM memory cells, but can be other types of memory cells including other types of resistive memory cells (e.g. FERAM, resistive RAM, carbon nanotube) in other embodiments. Each memory cell includes a memory storage element for storing a data value. In some embodiments, the memory storage element provides a high resistive data state or a low resistive data state depending on the value being stored. In some embodiments, the memory storage element in an MRAM memory cell includes a magnetic tunnel junction whose resistance is dependent upon the magnetization polarity of a programmable plate.

An enable array signal (AE0, AEM) is provided to enable transistors (131, 133, 135, 137,167, 169, 171, and 173) to enable an array circuit (103, 105) to perform memory read operations. The array circuits also include reference select transistors (115, 117, 147, and 149) for coupling the referenced devices (127, 129, 165, and 163) to a sense amplifier (111, 113, 141, 145) during a memory read operation. The select transistors are sized to match the coupling transistors (not shown) of the multiplexers (119, 113, 151, and 157) in order that the impedances of the bit lines of the reference devices (127) match the bit line impedance of the selected columns at the input of the sense amplifiers. As disclosed herein, two devices, characteristics, or parameters may also be considered to "match" if they are designed to be the same but in actuality they are not the same due to voltage, temperature, and/or process variation.

Although FIG. 1 shows two sense amplifiers per array circuit for providing two bits of data per array circuit, array circuits in other embodiments may include a different number of sense amplifiers per array circuit. Also, a memory may include a different number of arrays (e.g. 1 or more than 2). In other embodiments, the array of the memory cells may be configured in a "north-south" configuration.

In the embodiment shown, reference devices 127, 129, 165, and 163 are NFETs. However, in other embodiments, other types of devices (e.g. other types of transistors, variable resistors) may be used. The resistance of the reference devices 127, 129, 165, and 163 are set by a voltage signal VGR provided to their control terminals (e.g. a gate for a FET) that is produced by a global reference circuit 107. In one embodiment, the voltage of signal VGR is configured to reside in the linear range of the FETs of reference devices 127, 129, 165, and 163.

Memory 101 includes a controller 109 for controlling the operations of memory 101. In the embodiment shown, controller 109 receives control, data, and address signals from an external source (e.g. an on-chip processor, an off-chip processor, memory management unit). Based on the received control, address, and data signals, controller 109 asserts the appropriate word lines (WL0, WLM) and multiplexer select lines (Mux Select 0, Mux Select M) to select the requested memory cells to be read. Controller also provides the appropriate array enable signals (AE0, AEM) and reference select signals (RS0, RSM) as well as the global reference enable signal (GRN). Controller 109 may provide and receive other signals (not shown).

In some embodiments, memory 101 may be writeable where the write circuitry is not shown in FIG. 1. In one embodiment, memory 101 may be a stand-alone integrated circuit or may be included in an integrated circuit with other circuitry such as a processor (e.g. in a microprocessor or a processor with on chip memory) in other embodiments.

Figure 2:
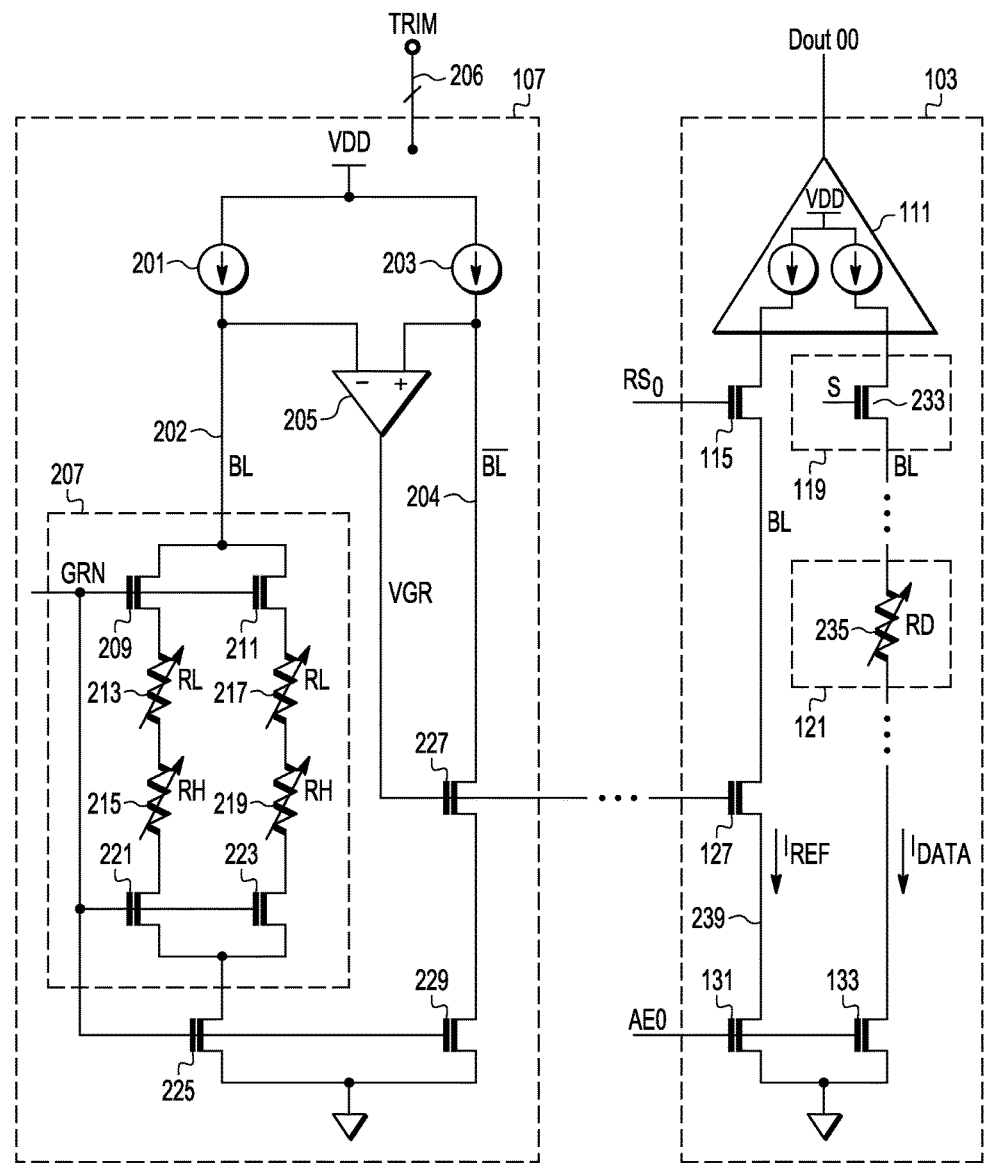
FIG. 2 is a circuit diagram of portions of the memory of FIG. 1 according to one embodiment of the present invention.

FIG. 2 is a circuit diagram showing specific features of the global reference circuit 107 and portions of a selected cell 235 coupled to a sense amplifier 111 during a memory read operation.

In the embodiment shown, global reference circuit 107 includes an operational amplifier 205, a resistance circuit 207, a master resistance device 227, current sources 201 and 203, enable transistors 225 and 229, and a trim input 206. In one embodiment, device 227 is implemented as an NFET, but may be implemented as another type of device in other embodiments e.g. such as another type of transistor or a variable resistor. In one embodiment, device 227 is the same type and size of device as devices 127, 129, 165, and 163.

In the embodiment shown, resistance circuit 207 includes four memory storage elements 213, 215, 217, and 219 that are the same type of memory storage elements of the memory cells of the column blocks 121, 125, 153, and 159 of memory 101. Elements 213 and 217 are configured in a low resistance data state and elements 215 and 219 are configured in a high resistance data state. In one embodiment where the memory storage elements are MRAM memory storage elements, a high resistance data state is characterized as a programmed state to indicate the storage of one data value (e.g. "1") and a low resistance data state is characterized as a non-programmed state to indicate the storage of another data value (e.g. "0"). Although in other embodiments, data values may be stored in other ways (e.g. for other types of memory cells).

Memory storage elements 213 and 215 are located in one current path of circuit 207 and memory storage elements 217 and 219 are located in another current path that is in parallel with the first current path to provide an overall resistance that is between the high resistance of elements 215 and 219 and the low resistance of elements 213 and 217. Circuit 207 also includes four transistors 209, 211, 221, and 223 that are sized to match select transistors (307 of FIG. 3) located in each memory cell of the column blocks 121, 125, 153, and 159. In one embodiment, the resistance of circuit 207 is equal to $(RH+RL)/2+R_{STONresistance}$, where RH is the resistance of memory storage element in a high resistance data state, RL is the resistance of memory element in a low resistance data state, and $R_{STONresistance}$ is the resistance of an NFET (209, 211, 221, and 223) when on.

One advantage of using memory storage elements in resistance circuit 207 that are of the same type as that used to store data in the memory is that the resistance provided by circuit 207 can vary over time, temperature, voltage, and/or process variation to match the variation of the memory cells the column blocks 121, 125, 153, and 159.

In other embodiments, reference cell may include other configurations and/or other circuitry. For example, in some embodiments, resistance circuit 227 may be a programmable resistor whose resistance is set to provide a midpoint resistance value between a high resistance data state of a memory cell and a low resistance memory state of a memory cell. In other embodiments, the low resistance data state elements 213 and 217 may be implemented with resistors in that for some memories, a non-programmed state may not vary greatly with time, temperature, voltage or process variation as with cells in the programmed state. In still other embodiments, the resistive circuit may include a different number of memory elements (e.g. 8, 16) with half in the low resistive data state and half in the high resistive data state.

In some embodiments, the memory storage elements of circuit 207 are located in one area of the integrated circuit of the memory. In other embodiments, they are located in one of the array circuits and are addressable. In other embodiments, some of the memory cells of circuit 207 are located in one array and the others are located in another array.

In one embodiment, memory 101 includes write circuitry (not shown) for periodically writing (and erasing) values in the memory storage elements 213, 217, 215, and 219 located in resistance circuit 207. With such an embodiment, the effect of memory cell writes on cell resistance is used in setting the reference resistance values of the reference devices (127).

During a memory read operation, the GRN signal is asserted to make transistors 209, 211, 221, 223, 225, and 229 conductive. After which time, current from current source 201 flows through resistance circuit 207 and current from current source 203 flows through master reference device 227. The voltage at the inverting input of operational amplifier 205 is dependent upon the resistance of circuit 207. The voltage of the non-inverting input of amplifier 205 is dependent upon the resistance of master reference device 227. The resistance of master reference device 227 is controlled by the output signal (VGR) of amplifier 205. Circuit 107 uses negative feedback to set the resistance of device 227 such that the voltages of the amplifier inputs match.

In one embodiment, circuit 107 is configured such that the voltage of signal VGR is in the linear range of operation of the transistor of device 227. In such a configuration, the resistance of device 227 matches the resistance of resistance circuit 207. As the resistance of the memory storage elements of circuit 207 change due to time, temperature, voltage, and/or process variation conditions, the output signal (VGR) of amplifier 205 changes such that the resistance of device 227 changes with the change in resistance of circuit 207.

The VGR signal is provided to the other reference devices (127, 129, 165, and 163) of memory 101 to control the resistance of those devices. Because, in some embodiments, those devices are the same type and size of device as master reference device 227, those devices will provide the same resistance as device 227, which is configured to match the resistance of circuit 207 in the embodiment of FIG. 2. Because the resistance of device 227 is controlled by the VGR signal to match the resistance of resistance circuit 207 whose resistance changes with various conditions, the resistance of the references devices (127, 129, 165, and 163) also changes with various conditions without having to use a set of reference memory storage elements (213, 215, 217, 219) for each sense amplifier. Accordingly, reference resistance accuracy can be maintained while minimizing the circuitry of the memory.

FIG. 2 also shows portion of memory array circuit 103 that is read by sense amplifier 111. In the embodiment of FIG. 2, memory cell 235 from column block 121 has been selected to be read by sense amplifier 111 by Mux Select 0 signals (shown as signal "S" provided to transistor 233 in FIG. 2 which is part of multiplexer 119) and WL0 signals asserted by controller 109 (which is provided to the select transistor (e.g. 307 of FIG. 3)) of memory cell 235. The read operation is started by asserting the GRN signal to make circuit 107 operational and then by asserting the AE0 signal and RS0 signal to make transistors 131, 133, and 135 conductive. After the assertion of the AE0 and RS0 signals, the Mux Select signals and appropriate word line, sense amplifier 111 determines whether cell 235 is in low resistance data state or the high resistance data state by comparing the resistance of cell 235 to the resistance of device 127.

In the embodiment shown, sense amplifier 111 determines the data state of memory cell 235 by providing a current $I_{DATA}$ through memory cell 235 and a current $I_{REF}$ through device 127 and comparing the resultant voltages. However, in other embodiments, a sense amplifier may work in other ways. In some embodiments, $I_{DATA}$ and $I_{REF}$ are the same magnitude as the currents produced by current sources 201 and 203 of global reference circuit 107 through current paths 202 and 204, respectively. In some embodiments, a sense amplifier may implement a multiphase data read that includes a precharge phase and a read phase. In some embodiments, the sense amplifier may include switching circuitry (not shown) that switches the coupling of the reference device 127 and memory cell 235 for the precharge and read phases.

Circuit 107 can be trimmed in a number of ways e.g. including by adjusting the current sources 201 or 203 or adjusting one or more of the resistance values of resistance circuit 207. In one embodiment, circuit 107 is trimmed such that the resistance provided by device 227 is at a maximum distance between a high resistance state and a low resistance state of a memory cell. In other embodiments, circuit 107 may include a trimming output (not shown) that is coupled to a node such as at an input of amplifier 205 or the output of amplifier 205 to provide a voltage for trimming.

Because the resistance value of the reference devices 127, 129, 165, and 163 is set by a trimmable global reference circuit 107, the reference resistance values provided by those reference devices (127, 129, 165, and 163) are also "trimmable" without having to include circuitry to trim each reference device. In some embodiments, the global reference circuit can be trimmed within 1% at a single temperature which produces local reference resistances (by devices 127, 129, 165, and 163) within 2% without local trimming.

Figure 3:
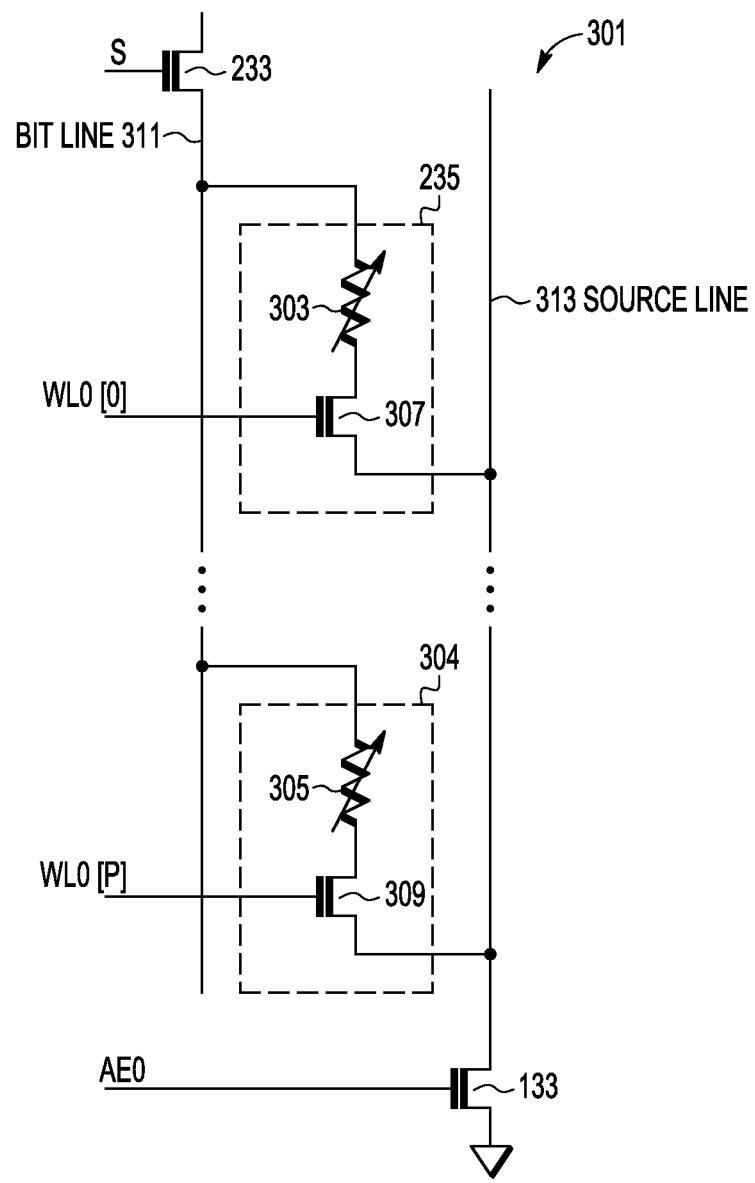
FIG. 3 is a circuit diagram of a column of the memory of FIG. 1 according to one embodiment of the present invention.

FIG. 3 is a circuit diagram of one embodiment of a column of memory cells (235 and 304) located in column block 121. Each cell includes a select transistor (307, 309) that is controlled by an asserted word line (WL0[0], WL0[P]). In one embodiment, the select transistor is the same size as transistors 209, 211, 221, and 223 so that the resistance of circuit 207 accounts for the resistance of the select transistors of the memory cells. Each memory cell 235 and 304 includes a memory storage element (303 and 305) for storing a value indicated by the resistance data state of the storage element. In one embodiment, the memory storage element is a magnetic tunnel junction whose resistance is dependent upon the magnetization polarity of a programmable plate. However, other types of memory storage elements may be used in other embodiments. In some embodiments, the memory storage elements 303 and 305 are the same type and size as memory storage elements 213, 217, 215, and 219.

Column 301 is implemented as a split column with a bit line 311 coupled to the sense amplifier (111) through transistor 233 and a source line 313 that is coupled to ground through transistor 133. Each cell is coupled to the bit line 311 and source line 313 such that the length of the coupling of the sense amplifier input to ground through a selected cell is the same for each cell of the column. In one embodiment, the bit line (239) that includes a reference device 127 for the column is the same length as the length of the coupling of lines 311 and 313 in order for the bit line 239 to match the parasitic capacitance of the column having the memory cell being read. Also in some embodiments, the lengths of the current paths 202 and 204 of reference circuit 107 also are sized to match the length of the entire current path that includes bit line 239 (including portions of the path in sense amplifier 111) and the entire current path of the selected column (including the portions of the path in sense amplifier 111) during a memory read operation. Other memories may have other configurations in other embodiments.

Although only one global reference circuit 107 is shown for memory 101, in other embodiments, a memory may have more than one global reference circuit. In some embodiments, each array circuit may have a global reference circuit that controls the resistance of the reference devices for that array.

In one embodiment, a memory includes a plurality of memory cells. Each memory cell of the plurality includes a memory storage element. The memory includes a plurality of sense amplifiers configured to read data from the plurality of memory cells and a plurality of reference cell devices. Each reference cell device of the plurality configured to provide a resistance to be compared by a sense amplifier of the plurality of sense amplifiers to a resistance of a memory cell of the plurality of memory cells indicative of a data value stored in the memory cell during memory read operations. Each reference cell device of the plurality of reference cell devices includes a control input to receive a signal for controlling the resistance of the reference cell device. The memory includes a global reference circuit. The global reference circuit includes a resistance circuit to provide a reference resistance, a master reference cell device, and an operational amplifier including a first input whose voltage is set by current flowing through the resistance circuit and a second input whose voltage is set by current flowing though the master reference cell device. The operational amplifier includes an output to control the resistance of the master reference cell device and resistances of the plurality of reference cell devices for memory read operations.

In another embodiment, a method of operating a memory includes providing a first current through a first current path including a resistance circuit and a node coupled to a first input of an operational amplifier to provide a first voltage to the first input. The method includes providing a second current through a second current path including a master reference device and a second node coupled to a second input of the operational amplifier to provide a second voltage to the second input of the operational amplifier. The method includes providing an output signal from the operational amplifier to control a resistance of the master reference device so that the first voltage at the first input of the operational amplifier matches the second voltage at the second input of the operational amplifier. The method includes using the output signal of the operational amplifier to set a resistance of a first reference device during a read of a first memory cell by a first sense amplifier where the first sense amplifier compares the resistance of the first reference device with a resistance of the first memory cell that is indicative of a data value stored in the first memory cell. The method includes using the output signal of the operational amplifier to set a resistance of a second reference device during a read of a second memory cell by a second sense amplifier where the second sense amplifier compares the resistance of the second reference device with a resistance of a second memory cell that is indicative of a data value stored in the second memory cell.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A memory comprising:
    a plurality of memory cells, each memory cell of the plurality including a memory storage element;
    a plurality of sense amplifiers configured to read data from the plurality of memory cells;
    a plurality of reference cell devices, each reference cell device of the plurality configured to provide a resistance to be compared by a sense amplifier of the plurality of sense amplifiers to a resistance of a memory cell of the plurality of memory cells indicative of a data value stored in the memory cell during memory read operations, each reference cell device of the plurality of reference cell devices including a control input to receive a signal for controlling the resistance of the reference cell device;
    a global reference circuit comprising:
        a resistance circuit to provide a reference resistance;
        a master reference cell device;
        an operational amplifier including a first input whose voltage is set by current flowing through the resistance circuit and a second input whose voltage is set by current flowing though the master reference cell device, the operational amplifier including an output to control the resistance of the master reference cell device and resistances of the plurality of reference cell devices for memory read operations.

2. The memory of claim 1 wherein the resistance of the resistance circuit is between a high resistance data state and a low resistance data state of the memory cells of the plurality of memory cells.

3. The memory of claim 1 wherein the resistance circuit includes a first memory storage element that is in a high resistance data state.

4. The memory of claim 3 wherein the resistance circuit includes a second memory storage element at a high resistance data state that is coupled in parallel to the first memory storage element.

5. The memory of claim 3 wherein the first memory storage element is of a same size and type as the memory storage elements of the plurality of memory cells.

6. The memory of claim 1 wherein the resistance circuit includes a first memory storage element, a second memory storage element, a third memory storage element, and a fourth memory storage element, wherein the first memory storage element and the third memory storage element are coupled in series in a first current path and the second memory storage element and the fourth memory storage element are coupled in series in a second current path, wherein the first current path and the second current path are coupled in parallel.

7. The memory of claim 6 wherein the first memory storage element and the second memory storage element are at a high resistance data state and the third memory storage element and the fourth memory storage element are at a low resistance data state.

8. The memory of claim 1 wherein each of the plurality of reference cell devices and the master reference cell device are characterized as an NFET.

9. The memory of claim 1 wherein:
    a first reference cell device of the plurality of reference cell devices is configured to provide a resistance to be compared by a first sense amplifier of the plurality of sense amplifiers to a resistance of a memory cell of the plurality of memory cells indicative of a data value stored in the memory cell;
    a second reference cell device of the plurality of reference cell devices is configured to provide a resistance to be compared by a second sense amplifier of the plurality of sense amplifiers to a resistance of a memory cell of the plurality of memory cells indicative of a data value stored in the memory cell.

10. The memory of claim 1 wherein an output of the operational amplifier controls the resistance of the master reference cell device such that the resistance of the master reference cell device matches the resistance of the resistance circuit.

11. The memory of claim 1 wherein the memory cells of the plurality of memory cells are characterized as resistive memory cells.

12. The memory of claim 1 wherein the global reference circuit includes an input to receive information to perform a trimming operation of the global reference circuit.

13. A method of operating a memory comprising:
    providing a first current through a first current path including a resistance circuit and a node coupled to a first input of an operational amplifier to provide a first voltage to the first input;
    providing a second current through a second current path including a master reference device and a second node coupled to a second input of the operational amplifier to provide a second voltage to the second input of the operational amplifier;
    providing an output signal from the operational amplifier to control a resistance of the master reference device so that the first voltage at the first input of the operational amplifier matches the second voltage at the second input of the operational amplifier;

using the output signal of the operational amplifier to set a resistance of a first reference device during a read of a first memory cell by a first sense amplifier where the first sense amplifier compares the resistance of the first reference device with a resistance of the first memory cell that is indicative of a data value stored in the first memory cell;

using the output signal of the operational amplifier to set a resistance of a second reference device during a read of a second memory cell by a second sense amplifier where the second sense amplifier compares the resistance of the second reference device with a resistance of a second memory cell that is indicative of a data value stored in the second memory cell.

14. The method of claim 13 wherein the first memory cell is located in a first column of an array of the memory and the second memory cell is located in a second column of the array.

15. The method of claim 13 wherein the first memory cell is located in a first array of a memory and the second memory cell is located in a second array of the memory.

16. The method of claim 13 wherein the master reference device, the first reference device, and the second reference device are each characterized as NFETs.

17. The method of claim 13 wherein the resistance circuit provides a resistance value that is between a high resistance data state value of a memory cell and a low resistance data state value of a memory cell.

18. The method of claim 13 wherein the resistance circuit includes at least one memory storage device programmed to a high resistance data state.

19. The method of claim 13 wherein the first memory cell and the second memory cell are each characterized as resistance memory cells.

20. The method of claim 13 wherein the resistance circuit includes a first memory storage element that is at a high resistance data state and a second memory storage element at a high resistance data state that is coupled in parallel to the first memory storage element, wherein providing a first current through a first current path includes providing current through the first memory storage element and the second memory storage element, wherein the first memory cell and the second memory cell each include a memory storage element of the same type as the first memory storage element and the second memory storage element.

* * * * *